United States Patent [19]

Patron

[11] Patent Number: 4,761,619

[45] Date of Patent: Aug. 2, 1988

[54] HIGH-FREQUENCY GENERATOR WITH IMPROVED CATHODE CURRENT REGULATED HIGH-FREQUENCY OSCILLATOR

[75] Inventor: Christian S. A. E. Patron, Eindhoven, Netherlands

[73] Assignee: U.S. Philips Corporation, New York, N.Y.

[21] Appl. No.: 18,678

[22] Filed: Feb. 25, 1987

[30] Foreign Application Priority Data

Mar. 17, 1986 [NL] Netherlands ........................ 8600672

[51] Int. Cl.[4] .......................... H03B 5/10; H05B 6/02

[52] U.S. Cl. .................................. 331/167; 219/10.77

[58] Field of Search ............................... 331/167-171, 331/182; 219/10.75, 10.77, 61.2

[56] References Cited

U.S. PATENT DOCUMENTS

| | | | |
|---|---|---|---|
| 3,571,644 | 3/1971 | Jakoubovitch | 331/167 X |
| 4,292,487 | 9/1981 | DeLeon | 219/10.77 X |
| 4,369,345 | 1/1983 | Czerlinski | 219/10.75 X |

*Primary Examiner*—Eugene R. LaRoche
*Assistant Examiner*—Robert Pascal
*Attorney, Agent, or Firm*—Thomas A. Briody; David R. Treacy; Bernard Franzblau

[57] ABSTRACT

A high-frequency heating generator, comprising an electron tube (B) for industrial systems ranging from several kilowatts to a number of megawatts. In similar systems employing an electron tube oscillator a substantial amount of power is dissipated in at least one control element (T) connected in the electron tube cathode circuit at power leads below the maximum power level of the apparatus. To obviate this drawback, an impedance circuit ($Z_K$) is connected in parallel with the control element (T), which circuit dissipates part of the power to be dissipated in the cathode circuit.

7 Claims, 1 Drawing Sheet

HIGH-FREQUENCY GENERATOR WITH IMPROVED CATHODE CURRENT REGULATED HIGH-FREQUENCY OSCILLATOR

BACKGROUND OF THE INVENTION

This invention relates to a high-frequency heating generator comprising an electron tube oscillator, the cathode circuit of the electron tube comprising at least one control element connected in series with the electron tube.

A high-frequency generator of the aforesaid type is known from the U.S. Pat. No. 3,448,407.

In the generator described in the patent mentioned above, for convenience, assuming that the maximum output power of the generator is so low that a single control element, for example a transistor or a cascade connection of transistors, can be used, the control element has to dissipate a non-insignificant power, which, needless to observe, should be within safe margins less than the maximum permissible power to be dissipated by that control element. If the latter is not the case, a plurality of series-connected control elements, as also described in the aforesaid Patent, will have to be resorted to.

SUMMARY OF THE INVENTION

An object of the present invention is to improve the known generator so that operating same with an equal number of control elements is more reliable, or that a smaller number of control, elements or possibly a single control element, will suffice.

To this end the invention provides a high-frequency generator of the type mentioned in the opening paragraph, characterized in that in parallel with the control element, an impedance circuit is connected for dissipating part of the power to be dissipated in the cathode circuit, when the control element, makes the generator supply less than the maximum power.

As the impedance circuit, provided in accordance with the invention, receives part of the power to be dissipated by the control element or a control element of the known generator, a smaller number of control elements or control elements designed for smaller powers can be used in the generator in accordance with the invention. For those skilled in the art it will be evident that the application of a smaller number of control elements, more specifically power transistors, is clearly advantageous. Not only can the generator in accordance with the invention consequently be cheaper, but also its application is cheaper as in the case of a breakdown of the control element or the control elements, which occurs all too frequently in practice, exchanging a smaller number of control elements is naturally cheaper and can be done more quickly.

The impedance circuit of a generator in accordance with the invention preferably has a non-linear impedance as a result of which more power can be received and thereby be used over a longer power range.

Tests in practice have shown that an impedance circuit in the form of a high resistance with a positive temperature coefficient, preferably one or more infrared lamps, gives entire satisfaction.

BRIEF DESCRIPTION OF THE DRAWING

The invention will now be further described with reference to the drawings, in which.

DESCRIPTION OF THE PREFERRED EMBODIMENTS

Figure 1:
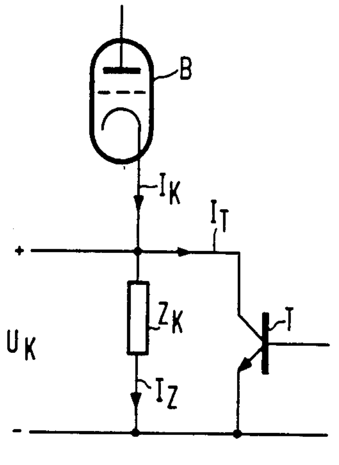
FIG. 1 shows schematically and in a highly simplified manner the electron tube and the cathode circuit of the electron tube oscillator in a generator embodying the present invention.
Figure 2:
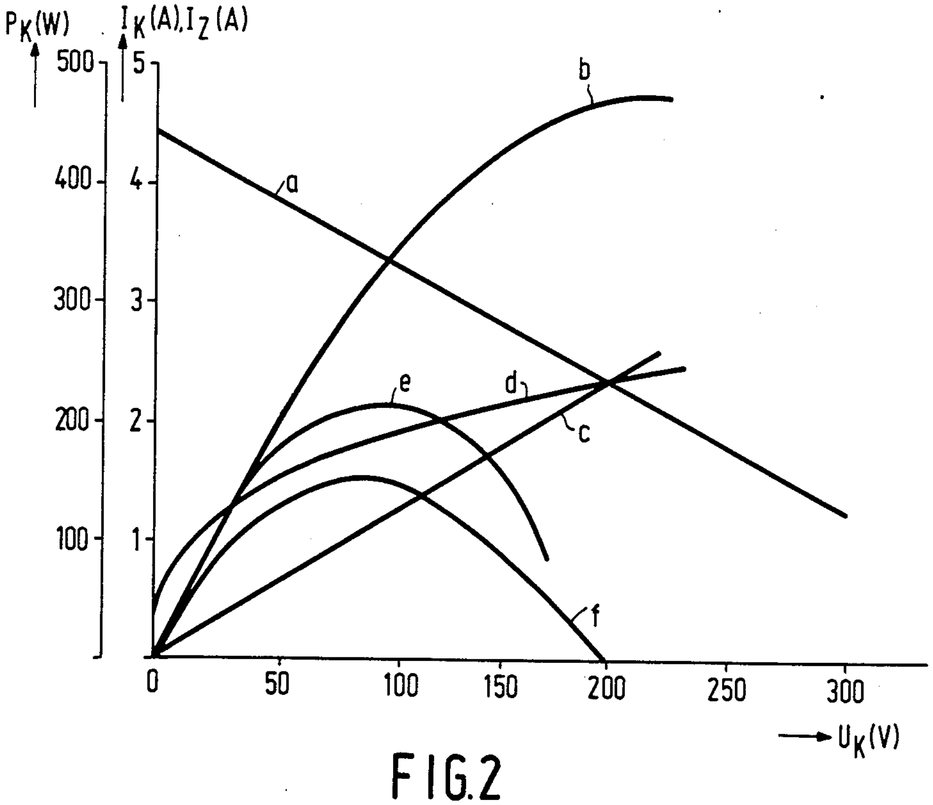
FIG. 2 is a graph showing various curves and straight lines in explanation of the generator of the present invention and for comparison with the known generator.

Basically, according to the invention, the high-frequency generator can be a high-frequency generator as described in the U.S. Pat. No. 3,448,407 mentioned in the preamble, more specifically as shown in FIGS. 1 and 2 of the drawings thereof. With a plurality of control elements or transistors and taking into account relevant transistor-tolerance effects, the compensating resistors are of the order of, for example 100 kilohms.

Considering the preceding paragraph, only the electron tube B and the cathode circuit T, $Z_K$ of the oscillator of the high-frequency generator are shown in FIG. 1 for further explanation of the high-frequency generator of the present invention. Therein T is the control element which is a transistor in the embodiment shown in FIG. 1, but which could likewise be a power FET or a GTO thyristor besides, possibly a Darlington or cascade connection of a plurality of power transistors, and $Z_K$ is an impedance circuit connection in parallel with the control element.

In FIG. 1 the cathode current is indicated by $I_K$, while the current through the impedance circuit $Z_K$ is indicated by $I_Z$. The cathode voltage is indicated by $U_K$ and the current through the transistor T is indicated by $I_T$.

In accordance with Kirchhoff's laws and dependent on the impedance of the impedance circuit $Z_K$ and the impedance in transistor T, seen from the cathode, the cathode current $I_K$, when applied, will be divided into the partial current $I_Z$ through the impedance circuit $Z_K$ and the partial current $I_T$ through the transistor T.

For a further explanation of the drawing of FIG. 1, reference will now be made to FIG. 2. FIG. 2 shows plotted along the abscissa the cathode voltage $U_K$ in volts, while along a first ordinate the cathode current $I_K$ and the partial current $I_Z$ through the impedance circuit $Z_K$ are plotted in amperes, while along a second ordinate the power $P_K$ dissipated by the transistor T is plotted in Watts.

In FIG. 2 the straight line a indicates the cathode current $I_K$ as a function of the cathode voltage $U_K$, that is the load line of the electron tube B. Line b indicates the power $P_K$ dissipated in the transistor T when the impedance circuit $Z_K$ has an infinite impedance, more specifically an infinite resistance, which case corresponds to the known high-frequency generator.

The straight line axis is representative of the power delivered by the generator to a load, for example one or a plurality of load coils. This power to be delivered is controlled by means of transistor T, more particularly by coupling a source of adjustable current to the base of transistor T, as described in the aforesaid U.S. Pat. No. 3,448,407. When observing the straight line a and the curve b it turns out that power $P_K$ to be dissipated by the transistor T increases quickly with decreasing power delivered by the generator. At a cathode voltage $U_K$ of slightly over 200 volts the power $P_K$ to be dissipated by the transistor T equals nearly 500 watts.

The straight line c shows the variation of the partial current $I_Z$ through the impedance circuit $Z_K$ as a function of the cathode voltage $U_K$ in the case where the load circuit is a resistor of 80 ohms. The relevant curve e indicates the variation as a function of the cathode voltage $U_K$ of the power $P_K$ to be dissipated by the transistor T with decreasing power to be delivered by the generator. The diagram of FIG. 2 shows that in this case the maximum power $P_K$ to be dissipated by the transistor T is found at a cathode voltage $U_K$ of slightly less than 100 volts and then amounts to slightly over 200 watts. This is a considerable improvement compared to the known generator (curve b).

It has turned out that even better results are to be obtained when the impedance circuit $Z_K$ in accordance with the invention has a non-linear impedance, more specifically a non-linear resistance. An advantageous implementation is the utilization of high-value resistors with a positive temperature coefficient, such as infrared lamps which are known to show a non-linear resistance behavior. In FIG. 2 the curve d indicates the variation of the partial current $I_Z$ through an infrared lamp $Z_K$ as a function of the cathode voltage $U_K$, while the relevant curve f indicates the power $P_T$ to be dissipated by the transistor T as a function of the cathode voltage $U_K$, wherefrom it is evident that the curve f remains under the curve e where ($Z_K$ is a resistor of 80 ohms). More specifically, at a cathode voltage $U_K$ of approximately 75 volts, a maximum power $P_K$ to be dissipated by the transistor T of 150 watts is obtained, being less by a factor 2 than the prior art case, which factor will only increase when further reducing the power to be supplied by the generator, while it should be observed that a generator is naturally selected in accordance with the practicability of the working capacity. In practice the impedance circuit $Z_K$ may comprise an infrared lamp of for example, 2 or 3 kW;. Dependent on the cathode voltage $U_K$ of the electron tube B, this may also comprise a series-connection of a plurality, possibly 3, of these infrared lamps.

With respect to the control of the transistor T, it can be observed that this may be carried out by a continuously controllable current, or a pulsating current. The latter control will more specifically be utilized with higher powers.

Roughly speaking, a single 2.5 kilowatt-transistor can be utilized as the control element for a 25 kilowatt-generator with a triode in the oscillator. When making use of a tetrode or a pentode in the oscillator, a single transistor of approximately 0.6 kilowatt rating can be utilized as the control element for the 25 kilowatt-high-frequency generator.

What is claimed is:

1. A high-frequency heating generator comprising an electron tube oscillator including an electron tube having a cathode circuit comprising at least one control element connected in series with the electron tube, said control element being operative to adjust output power of the electron tube oscillator up to a maximum power level and for dissipating a part of the power at power levels below said maximum power level, and an impedance circuit connected in parallel with the control element for dissipating part of the power to be dissipated in the cathode circuit when the control element is adjusted to produce a power level less than the maximum power level.

2. A generator as claimed in claim 1, characterized in that the impedance circuit has a non-linear impedance.

3. A generator as claimed in claim 2, characterized in that the impedance circuit comprises at least one resistor with a positive temperature coefficient.

4. A generator as claimed in claim 3, characterized in that the impedance circuit comprises at least one infrared lamp.

5. A generator as claimed in claim 1 wherein the impedance circuit comprises at least one infrared lamp.

6. A generator as claimed in claim 1 wherein said control element comprises a power transistor having a control electrode for coupling to a source of adjustable control current thereby to adjust the output power level of the high frequency heating generator.

7. A generator as claimed in claim 1 wherein said control element comprises a transistor for adjusting the output power of the electron tube oscillator, and wherein cathode current of said electron tube flows in part through the transistor and in part through the impedance circuit.

* * * * *